US009968000B2

(12) United States Patent
Ollila et al.

(10) Patent No.: US 9,968,000 B2
(45) Date of Patent: May 8, 2018

(54) ARRANGEMENT FOR COOLING CHANNELS IN AN ELECTRODE SYSTEM

(71) Applicant: OUTOTEC (FINLAND) OY, Espoo (FI)

(72) Inventors: Janne Ollila, Espoo (FI); Tom Rönnberg, Espoo (FI); Seppo Juvonen, Porvoo (FI)

(73) Assignee: OUTOTEC (FINLAND) OY, Espoo (FI)

( * ) Notice: Subject to any disclaimer, the term of this patent is extended or adjusted under 35 U.S.C. 154(b) by 203 days.

(21) Appl. No.: 14/912,007

(22) PCT Filed: Aug. 20, 2014

(86) PCT No.: PCT/FI2014/050640
§ 371 (c)(1),
(2) Date: Feb. 12, 2016

(87) PCT Pub. No.: WO2015/028707
PCT Pub. Date: Mar. 5, 2015

(65) Prior Publication Data
US 2016/0198590 A1    Jul. 7, 2016

(30) Foreign Application Priority Data
Aug. 27, 2013   (FI) .................................. 20135862

(51) Int. Cl.
*H05B 7/10*       (2006.01)
*H05B 7/12*       (2006.01)
(Continued)

(52) U.S. Cl.
CPC ......... *H05K 7/20218* (2013.01); *F27B 3/085* (2013.01); *F27D 11/08* (2013.01); *F27D 11/10* (2013.01); *F27D 2099/0021* (2013.01)

(58) Field of Classification Search
CPC . H05B 7/06; H05B 7/085; H05B 7/10; H05B 7/11; H05B 7/14; H05B 7/102;
(Continued)

(56) References Cited

U.S. PATENT DOCUMENTS 2,673,227 A * 3/1954 Hubert ..................... H05B 7/10
                                                        373/100
2,884,475 A * 4/1959 Foyn ...................... H05B 7/105
                                                        373/100
(Continued)

FOREIGN PATENT DOCUMENTS

AU       2006 225 192 A1    4/2007
CN          1926923 A       3/2007
(Continued)

OTHER PUBLICATIONS

Search Report issued by the Finnish Patent and Registration Office in corresponding Finnish Patent Application No. 20135862 dated Apr. 23, 2014 (2 pages).
(Continued)

*Primary Examiner* — Hung D Nguyen
(74) *Attorney, Agent, or Firm* — Buchanan, Ingersoll & Rooney PC

(57) ABSTRACT

Provided is an arrangement for cooling channels in an electrode column assembly of an electric arc furnace, wherein the lower part of the electrode column assembly is provided with a contact shoe ring formed of a plurality of contact shoe elements, a pressure ring formed of a plurality of pressure blocks, and a heat shield located above the pressure ring and formed of a plurality of heat shield segments. The contact shoe elements and/or the pressure blocks are provided with channels for a cooling liquid to flow therein. The channels made in the material of the contact shoe elements and/or the pressure blocks extend obliquely downwards from the upper ends of said contact shoe elements and/or the pressure blocks near to the lower ends of the same. At least two of said oblique channels join together at their lower ends to form a continuous channel.

10 Claims, 5 Drawing Sheets

(51) Int. Cl.
 H05K 7/20 (2006.01)
 F27B 3/08 (2006.01)
 F27D 11/08 (2006.01)
 F27D 11/10 (2006.01)
 F27D 99/00 (2010.01)

(58) Field of Classification Search
 CPC ........ H05B 7/103; H05B 7/105; H05B 7/107; H05B 7/109; F27B 3/08; F27B 3/085; F27B 3/10; F27B 3/14; F27B 3/24; F27D 11/08; F27D 11/10; F27D 2099/0021; H05K 7/20218
 USPC .............. 373/94, 95, 96, 97, 99, 100, 88, 98
 See application file for complete search history.

(56) References Cited

U.S. PATENT DOCUMENTS

| | | | |
|---|---|---|---|
| 4,575,856 A | 3/1986 | Persson | |
| 8,960,679 B2* | 2/2015 | Ollila | H05B 7/12 373/95 |
| 2011/0090934 A1 | 4/2011 | Xia et al. | |

FOREIGN PATENT DOCUMENTS

| | | |
|---|---|---|
| CN | 202793016 U | 3/2013 |
| CN | 202793025 U | 3/2013 |
| EP | 1 971 190 A2 | 9/2008 |
| FR | 2 922 076 A1 | 4/2009 |
| SU | 1700779 A1 | 12/1991 |
| WO | WO 01/03873 A1 | 1/2001 |
| WO | WO 2005/009084 A1 | 1/2005 |
| WO | WO 2005/071335 A2 | 8/2005 |
| WO | WO 2009/037649 A2 | 3/2009 |
| WO | WO 2014/118147 A1 | 8/2014 |
| ZA | 9 903 870 A | 2/2001 |
| ZA | 9 903 871 A | 2/2001 |
| ZA | 200 501 486 A | 9/2005 |

OTHER PUBLICATIONS

International Search Report (PCT/ISA/210) dated Feb. 16, 2015, by the European Patent Office as the International Searching Authority for International Application No. PCT/FI2014/050640.

Written Opinion (PCT/ISA/237) dated Feb. 16, 2015, by the European Patent Office as the International Searching Authority for International Application No. PCT/FI2014/050640.

* cited by examiner

ARRANGEMENT FOR COOLING CHANNELS IN AN ELECTRODE SYSTEM

FIELD OF THE INVENTION

The present invention relates to an arrangement for cooling channels in an electrode column assembly of an electric arc furnace. More specifically, the invention relates to an arrangement for cooling channels in an electrode column assembly of an electric arc furnace, the lower part of which electrode column assembly being provided with an electrode lower column assembly comprising a contact shoe ring formed of a plurality of contact shoe elements connected to each other in an annular form and placed in contact with the electrode to conduct electric current to the electrode, a pressure ring formed of a plurality of pressure blocks connected to each other to form an annular ring surrounding the contact shoe ring, the pressure blocks of said pressure ring being provided with hydraulic bellows by which the contact shoe ring is pressed against the steel mantle of the electrode, and a heat shield located above the pressure ring in the axial direction of the electrode column assembly, said heat shield comprising a plurality of heat shield segments connected to each other to form an annular ring surrounding the lower electrode column assembly, whereby the contact shoe elements and/or the pressure blocks are provided with channels through which a cooling liquid is made to flow for cooling of the contact shoe ring and the pressure ring.

BACKGROUND OF THE INVENTION

An electric arc furnace is an electrically operated furnace used for melting metal and/or for cleaning slag. The operation of the furnace is based on an arc flame that burns either between separate electrodes, or between electrodes and the material to be melted. The furnace may be operated either by AC or DC current. Heat is created in the arc flame, and also in the material to be melted, in case the arc flame burns between the material and the electrodes. Power is conducted to vertical electrodes that are located symmetrically in a triangle with respect to the midpoint of the furnace. In the case of a DC smelting furnace there is one electrode in the middle of the furnace. The assembly depth of the electrodes in the furnace is continuously adjusted, because they are worn at the tips owing to the arc flame.

The lower part of the electrode column assembly comprises a contact shoe ring, a pressure ring and a heat shield. The contact shoe ring consists of a plurality of contact shoe elements arranged as a ring to be in contact with a steel mantle inside of which the electrode paste is sintered. Such an electrode is a so-called Söderberg electrode. The contact shoe elements conduct electric current to the electrode. A pressure ring is arranged on the outside of the contact shoe ring, so that the contact shoe ring is surrounded by said pressure ring. The pressure ring consists of a plurality of pressure blocks connected with each other as a ring, which pressure blocks being provided with hydraulic bellows by which the contact shoes in the contact shoe ring are pressed against the steel mantle of the electrode. A heat shield surrounding the electrode column assembly is arranged above the pressure ring in the axial direction of the electrode column assembly. Also the heat shield is comprised of a plurality of segments connected with each other to form an assembly of annular form.

Because of the extremely hot environment the contact shoe elements, pressure ring and heat shield must be cooled and in current electrode column assemblies cooling is arranged so that the contact shoe elements, pressure ring blocks and heat shield segments are provided with cooling channels for flowing cooling liquid. Cooling channels are made so that borings are drilled in the contact shoes, pressure ring blocks and heat shield segments. Borings are drilled so that they extend through said parts within which at least some of the borings are joining with each other. Therefore at least some of the borings must be closed with plugs. Plugging of the borings causes a risk for leaking of the cooling liquid. Leaks in the electrode column assemblies are very detrimental, especially when leaking plugs are situated in the hot lower end of the rings where they are not visible.

OBJECTIVE OF THE INVENTION

An objective of the present invention is to provide a cooling channel arrangement for an electrode column assembly of an electric arc furnace which overcomes the disadvantages and drawbacks relating to prior art, especially when it comes to the problems relating to the leaking of the cooling liquid.

A further objective of the present invention is to provide a cooling channel arrangement for an electrode column assembly of an electric arc furnace, by which arrangement an adequate channel system and flow amount of the cooling liquid are attained in the contact shoe ring, pressure ring and heat shield.

SUMMARY OF THE INVENTION

The objectives of the present invention are attained by the arrangement in which the channels made in the material of the contact shoe elements and/or the pressure blocks extend obliquely downwards from the upper ends of the contact shoe elements and the pressure blocks near to the lower ends of the same, so that at least two of said oblique channels in a same contact shoe element and/or pressure block join together at their lower ends near the lower ends of the contact shoe elements and the pressure blocks to form a continuous channel in each contact shoe element and pressure block.

In the arrangement at least two oblique channels are made in the material of each contact shoe element and/or pressure block, so at least a single continuous channel is formed in the respective contact shoe element and/or pressure block. On the other hand a plurality of oblique channels can be made in the material of each contact shoe element and/or pressure block to form several continuous channels in the respective contact shoe element and/or pressure block.

The channels in the material of the contact shoe elements and/or the pressure blocks are preferably made by drilling. The channels are made in the material of the contact shoe elements and/or the pressure blocks with a safety distance between the channels.

Also the heat shield segments are preferably provided with similar oblique channels as the contact shoe elements and/or the pressure blocks.

The contact shoe elements and/or the pressure blocks and/or the heat shield segments are made of an electrical and thermal conductive material with a high mechanical strength. The material is preferably copper. Also other materials, e.g. brass or bronze are applicable.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
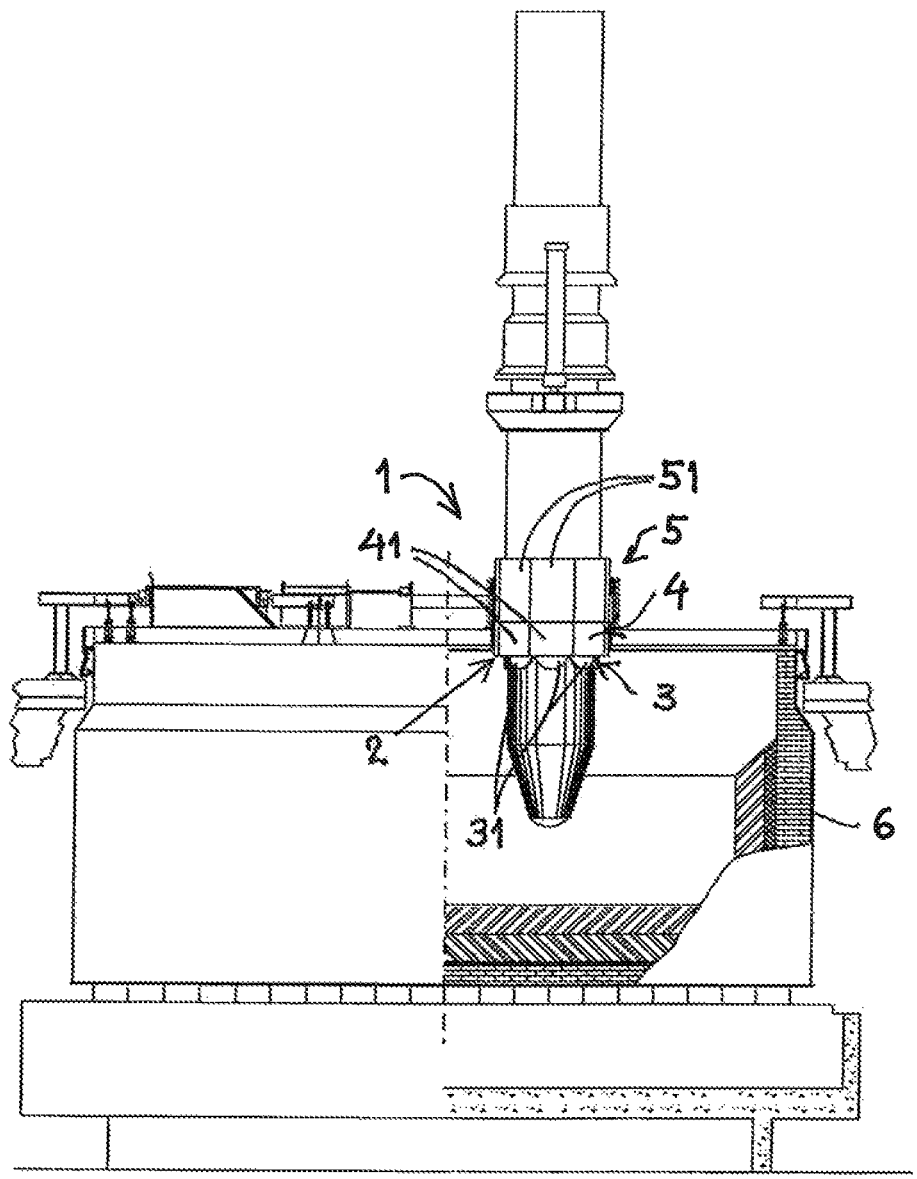
FIG. 1 is a schematic elevation side view of an electric arc furnace.

FIG. 1 shows a schematic illustration of an electric arc furnace 6. The furnace 6 comprises a plurality of electrode column assemblies 1, but for the sake of simplicity only one of them is shown in FIG. 1.

Figure 2:
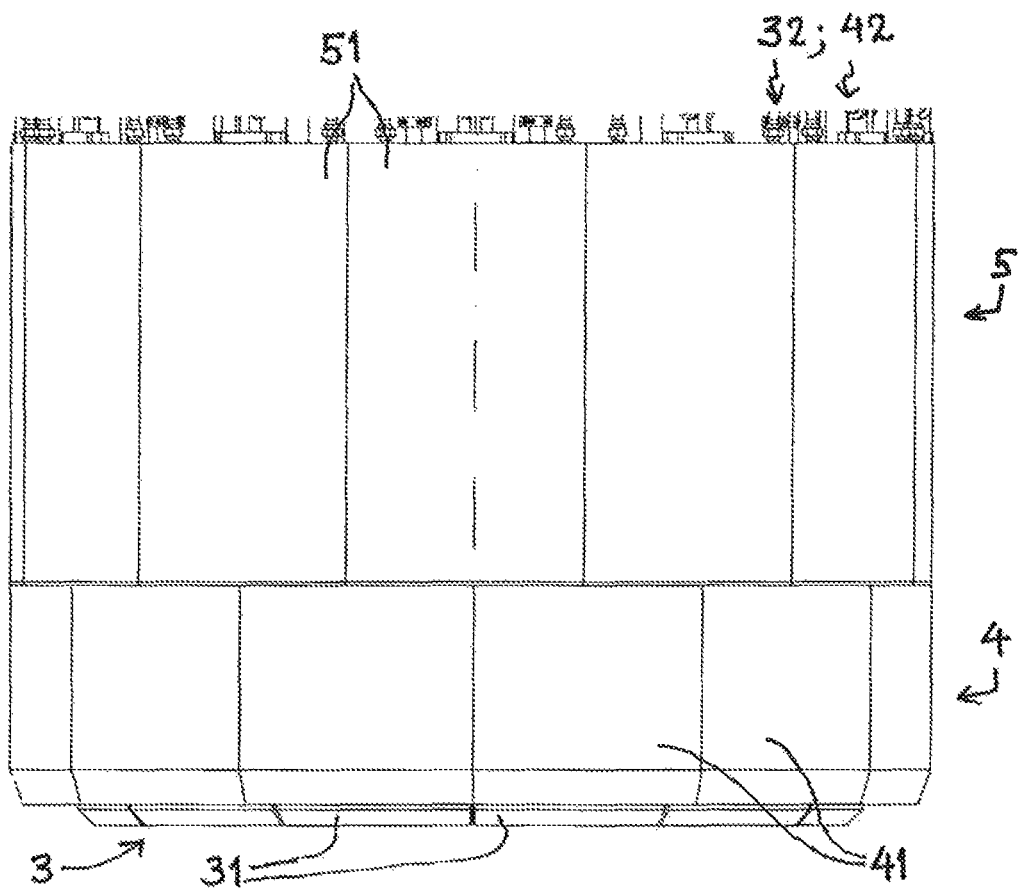
FIG. 2 is schematic elevation side view of a lower electrode column assembly of the electric arc furnace of FIG. 1 in a larger scale.
Figure 3:
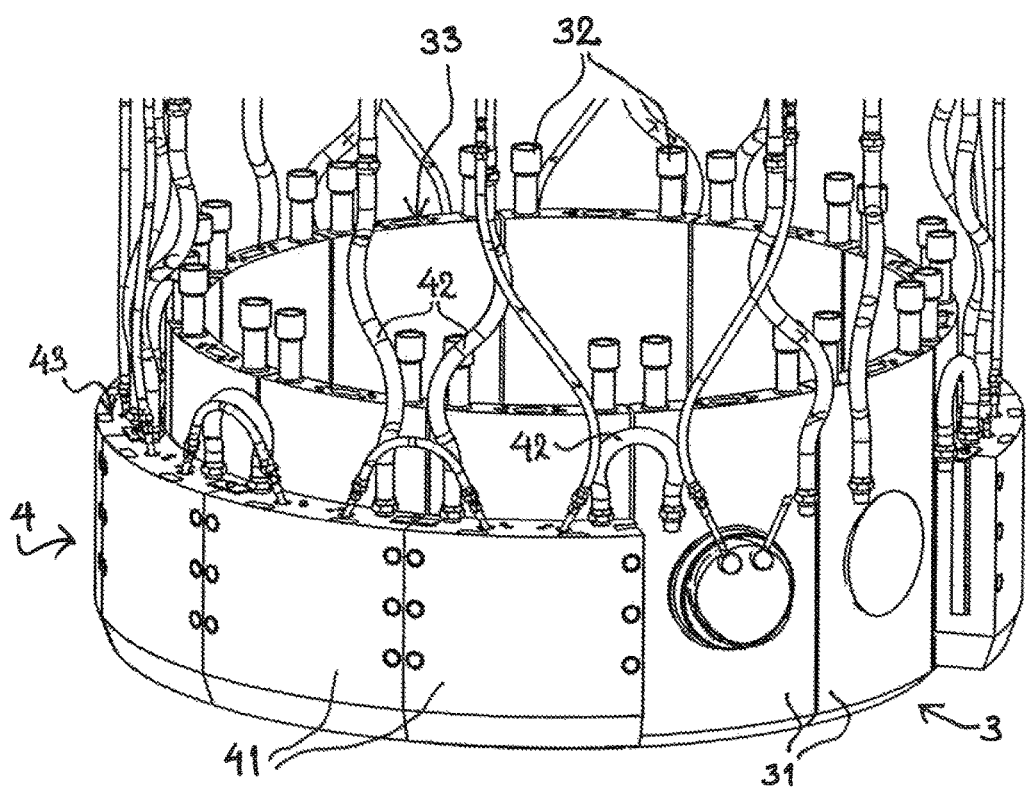
FIG. 3 is an axonometric view of the lower electrode column assembly.

With reference to FIGS. 1, 2 and 3 an electrode lower column assembly 2 is located in the lower part of the electrode system. The electrode lower column assembly 2 comprises a contact shoe ring 3, a pressure ring 4 and a heat shield 5. The contact shoe ring 3 is configured to be placed in contact with the electrode to conduct electric current to the electrode. The contact shoe ring 3 comprises a plurality of contact shoe elements 31. The contact shoe elements 31 are arranged in an annular form to surround the electrode. The contact shoes 31 are pressed against the steel mantle of the electrode with the aid of a plurality of hydraulic bellows arranged in the pressure ring 4 that surrounds the contact shoe ring 3. The pressure ring 4 comprises a plurality of pressure blocks 41 connected to each other to form an annular ring. Preferably each of the pressure blocks 41 is provided with a hydraulic bellow as mentioned above. A heat shield 5 is located above the pressure ring 4 in the axial direction of the electrode column assembly 1. The heat shield 5 comprises a plurality of heat shield segments 51 connected to each other to form an annular ring surrounding the lower electrode column assembly 2.

As it can be seen in FIGS. 2 and 3 pipes 32, 42 are connected to the contact shoe elements 31 of the contact shoe ring 3 and to the pressure blocks 41 of the pressure ring 4. Said pipe connections are arranged at upper ends 33, 43 of the contact shoe elements 31 and pressure blocks 41. The pipes 32, 42 are arranged for a cooling liquid to be led into and out of the contact shoe elements 31 and pressure blocks 41 to maintain their temperature at a desired level. Naturally, corresponding channels are made in the material of the contact shoe elements 31 and pressure blocks 41. So, cooling liquid is made to flow and circulate in the contact shoe ring 3 and pressure ring 4. The piping can be arranged so that the cooling fluid flows separately through each contact shoe element 31 and/or from one element to another. In a corresponding way the cooling fluid can be made to flow separately through each pressure block 41 and/or from one block to another.

Figure 4:
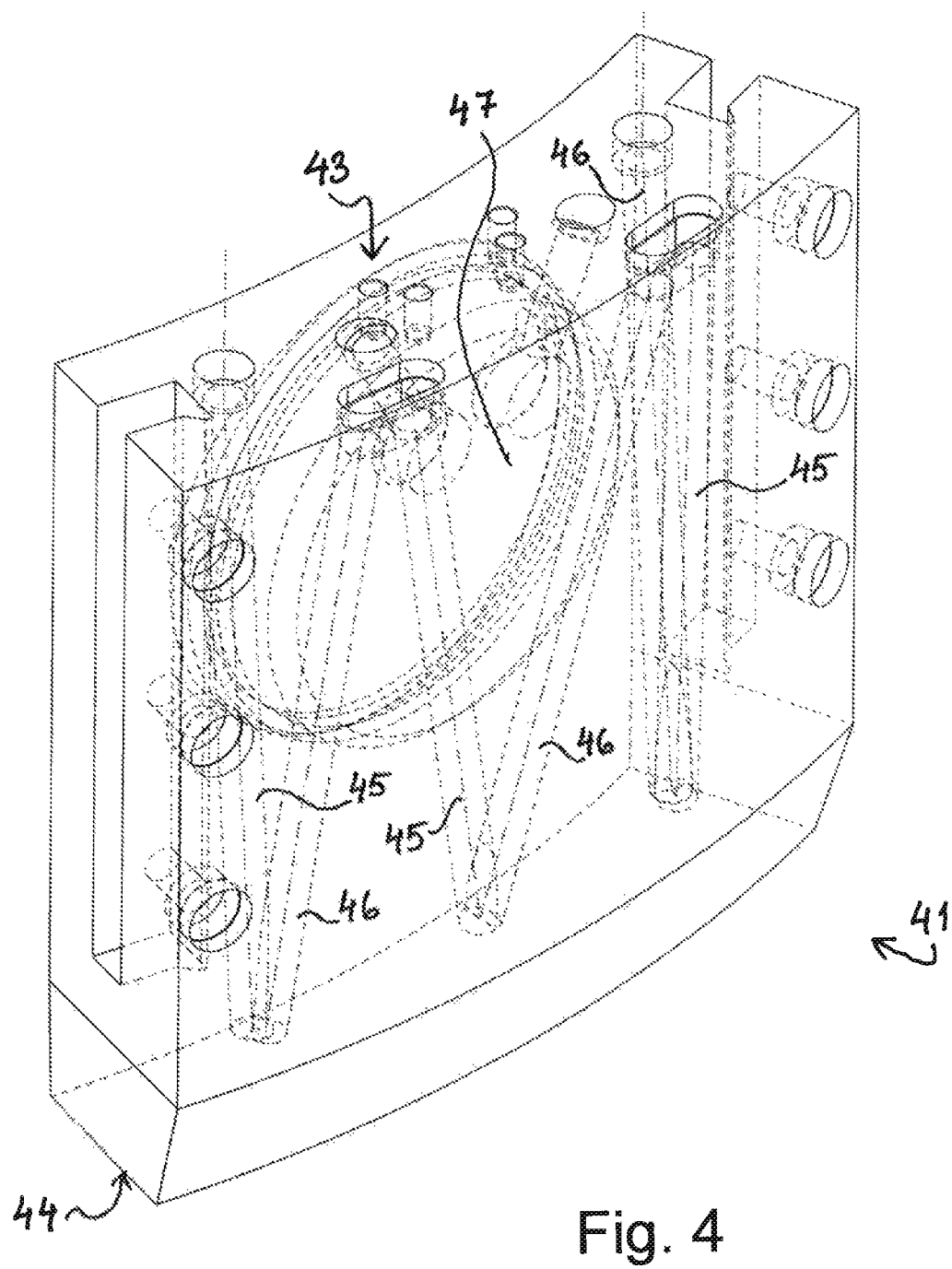
FIG. 4 is an axonometric view of a pressure block with the bellows cylinder in an exploded view.
Figure 5:
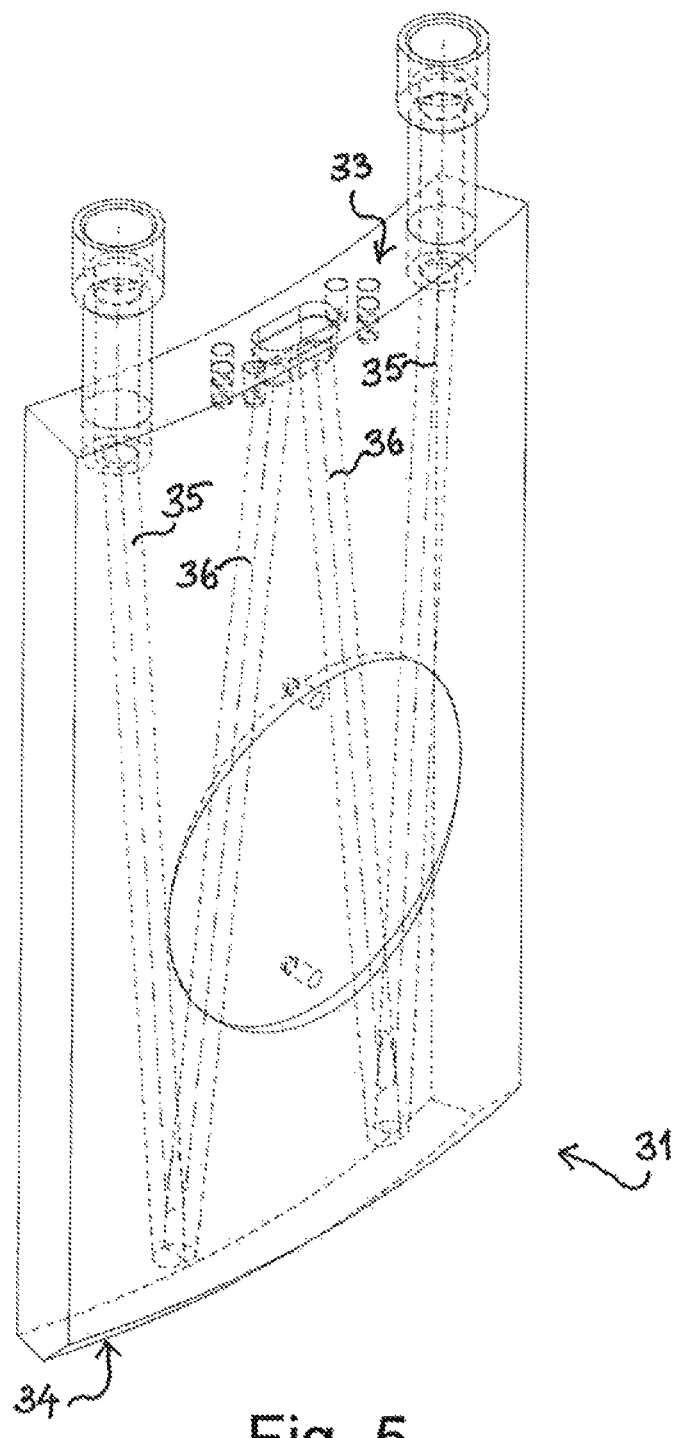
FIG. 5 is a cross-sectional view of the pressure block showing the structure of the bellows cylinder in more detail.

The channel arrangements for the pressure blocks 41 and contact shoe elements 31 are shown in FIGS. 4 and 5. As it can be seen in FIG. 4, the channels 45, 46 in the pressure block 41 are made in the material of the block so that they extend obliquely downwards from the upper end 43 of the pressure block 41 near to the lower end 44 of the block. Further, the channels 45, 46 are made so, that two oblique channels 45, 46 join together at their lower ends, i.e. near the lower end 44 of the pressure block 41. At least two channels 45, 46 joining together at their lower ends are made in the material of the pressure block, but FIG. 4 shows that the pressure block 41 comprises preferably a plurality of oblique channels 45, 46. So, pipes 42 for the cooling liquid are connected to the upper ends of the channels 45, 46.

As it can be seen in FIG. 5, the channels 35, 36 in the contact shoe element 31 are made in the material of the element so that they extend obliquely downwards from the upper end 33 of the contact shoe element 31 near to the lower end 34 of the element. In a corresponding way shown in FIG. 4, the channels 35, 36 are made so, that two oblique channels 35, 36 join together at their lower ends, i.e. near the lower end 34 of the contact shoe element 31. At least two channels 35, 36 joining together at their lower ends are made in the material of the contact shoe element 31, but FIG. 5 shows that the contact shoe element 31 comprises preferably a plurality of oblique channels 35, 36. So, pipes 32 (FIGS. 2 and 3) for the cooling liquid are connected to the upper ends of the channels 35, 36.

If and/or when any of the channels 35, 36; 45, 46 in the contact shoe elements 31 and/or pressure blocks 41 has to be closed with a plug, such plug is placed only at the upper end 33, 43 of the element 31 and/or block 41, which minimizes the risk of cooling liquid leaks.

The contact shoe elements 31 are made of a material having good electrical and thermal conductivity. Further, the mechanical strength of the material must be high. E.g. copper is a material which fulfills these properties. Copper is a massive material which is very well applicable for the contact shoe elements 31. Other materials that could be used for this purpose are e.g. brass and bronze. Also other materials having corresponding properties can be used. Preferably the pressure blocks 41 are made of the same material as the contact shoe elements 31.

The channels 35, 36; 45, 46 in the contact shoe elements 31 and in the pressure blocks 41 are made by drilling. To obtain an adequate cooling in the contact shoe elements 31 the pressure blocks 41 it is important that the channels 35, 36; 45, 46 or borings made by drilling cover the whole area of the contact shoe elements 31 and the pressure blocks 41 as well as possible. However, an adequate safety distance, e.g. 20 mm, remains between the borings.

The same channel system can be used also in the heat shield segments 51 which are preferably made of a similar material as the contact shoe elements 31 and the pressure blocks 41.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. An arrangement for cooling channels in an electrode column assembly of an electric arc furnace, the lower part of which electrode column assembly being provided with an electrode lower column assembly comprising a contact shoe ring formed of a plurality of contact shoe elements connected to each other in an annular form and placed in contact with an electrode to conduct electric current to the electrode, a pressure ring formed of a plurality of pressure blocks connected to each other to form an annular ring surrounding the contact shoe ring, the pressure blocks of said pressure ring being provided with hydraulic bellows by which the contact shoe ring is pressed against a steel mantle of the electrode, and a heat shield located above the pressure ring in the axial direction of the electrode column assembly, said heat shield comprising a plurality of heat shield segments connected to each other to form an annular ring surrounding the lower electrode column assembly, whereby the contact shoe elements and/or the pressure blocks are provided with channels through which a cooling liquid is made to flow for cooling of the contact shoe ring and the pressure ring, wherein the channels made in the material of the contact shoe elements and/or the pressure blocks extend obliquely downwards from the upper ends of the contact shoe elements and the pressure blocks near to the lower ends of the same, so that at least two of said oblique channels in a same contact shoe element and/or pressure block join together at their lower ends near the lower ends of the contact shoe elements and the pressure blocks to form a continuous channel in each contact shoe element and pressure block.

2. The arrangement as claimed in claim 1, wherein at least two oblique channels are made in the material of each contact shoe element and/or pressure block, so at least a single continuous channel is formed in the respective contact shoe element and/or pressure block.

3. The arrangement as claimed in claim 1, wherein a plurality of oblique channels are made in the material of each contact shoe element and/or pressure block to form several continuous channels in the respective contact shoe element and/or pressure block.

4. The arrangement as claimed in claim 1, wherein the channels in the material of the contact shoe elements and/or the pressure blocks are made by drilling.

5. The arrangement as claimed in claim 4, wherein the channels are made in the material of the contact shoe elements and/or the pressure blocks with a safety distance between the channels.

6. The arrangement as claimed in claim 1, wherein the heat shield segments are provided with similar oblique channels as the contact shoe elements and/or the pressure blocks.

7. The arrangement as claimed in claim 1, wherein the contact shoe elements and/or the pressure blocks and/or the heat shield segments are made of an electrical and thermal conductive material with a high mechanical strength.

8. The arrangement as claimed in claim 7, wherein the material of the contact shoe elements and/or the pressure blocks and/or the heat shield segments is copper.

9. The arrangement as claimed in claim 7, wherein the material of the contact shoe elements and/or the pressure blocks and/or the heat shield segments is brass.

10. The arrangement as claimed in claim 7, wherein the material of the contact shoe elements and/or the pressure blocks and/or the heat shield segments is bronze.

* * * * *